United States Patent
Lee et al.

(10) Patent No.: US 9,982,342 B2
(45) Date of Patent: May 29, 2018

(54) ZN—MG ALLOY-COATED STEEL SHEET WITH EXCELLENT BLACKENING RESISTANCE AND EXCELLENT ADHESION

(71) Applicant: POSCO, Pohang-si, Gyeongsangbuk-do (KR)

(72) Inventors: Dong-Yoeul Lee, Gwangyang-si (KR); Kyung-Hoon Nam, Gwangyang-si (KR); Yong-Hwa Jung, Gwangyang-si (KR); Seok-Jun Hong, Gwangyang-si (KR); Tae-Yeob Kim, Gwangyang-si (KR); Young-Jin Kwak, Gwangyang-si (KR); Mun-Jong Eom, Gwangyang-si (KR); Woo-Sung Jung, Gwangyang-si (KR)

(73) Assignee: POSCO, Gyeongsangbuk-Do (KR)

( * ) Notice: Subject to any disclaimer, the term of this patent is extended or adjusted under 35 U.S.C. 154(b) by 0 days. days.

(21) Appl. No.: 15/238,358

(22) Filed: Aug. 16, 2016

(65) Prior Publication Data

US 2016/0355926 A1    Dec. 8, 2016

Related U.S. Application Data

(62) Division of application No. 14/368,724, filed as application No. PCT/KR2012/011540 on Dec. 27, 2012, now Pat. No. 9,441,302.

(30) Foreign Application Priority Data

Dec. 27, 2011 (KR) .......................... 10-2011-0143891

(51) Int. Cl.
   *C23C 16/453* (2006.01)
   *C23C 14/16* (2006.01)
   (Continued)

(52) U.S. Cl.
   CPC .......... *C23C 16/453* (2013.01); *B32B 15/013* (2013.01); *C23C 14/16* (2013.01);
   (Continued)

(58) Field of Classification Search
   CPC ....... C23C 16/40; C23C 14/16; C23C 16/453; C23C 28/321; C23C 16/401;
   (Continued)

(56) References Cited

U.S. PATENT DOCUMENTS 5,648,177 A      7/1997  Fukui et al.
2001/0042491 A1  11/2001 Shimakura et al.
(Continued)

FOREIGN PATENT DOCUMENTS

CN    1135537 A    11/1996
JP    07-268605    10/1995
(Continued)

OTHER PUBLICATIONS

Machine Translation, Yoshikazu et al., JP 10-219475, Aug. 1998.*
(Continued)

*Primary Examiner* — Michael E. La Villa
(74) *Attorney, Agent, or Firm* — Cantor Colburn LLP

(57) ABSTRACT

The present invention relates to a Zn—Mg alloy-coated steel sheet with excellent blackening resistance and excellent coating adhesion and to a method for manufacturing same. Provided are a Zn—Mg alloy-coated steel sheet with excellent blackening resistance and excellent adhesion and a method for manufacturing same, the steel sheet comprising: a substrate steel sheet; a Zn—Fe intermetallic compound layer formed on the substrate steel sheet; a first Zn—Mg coating layer formed on the Zn—Fe intermetallic compound layer and comprising a Zn—Fe intermetallic compound in which the content of Zn is 95% by weight or higher; a second Zn—Mg coating layer formed on the first Zn—Mg
(Continued)

coating layer and comprising a Zn—Mg intermetallic compound in which the content of Zn is 80 to 95% by weight; and an oxide film formed on the second Zn—Mg coating layer and comprising a metallic oxide.

5 Claims, 2 Drawing Sheets

(51) Int. Cl.
| | |
|---|---|
| *C23C 28/00* | (2006.01) |
| *C23C 16/40* | (2006.01) |
| *B32B 15/01* | (2006.01) |
| *C23C 28/02* | (2006.01) |
| *C23C 30/00* | (2006.01) |
| *C23C 14/58* | (2006.01) |

(52) U.S. Cl.
CPC ......... *C23C 14/165* (2013.01); *C23C 14/58* (2013.01); *C23C 14/5846* (2013.01); *C23C 14/5853* (2013.01); *C23C 16/40* (2013.01); *C23C 16/401* (2013.01); *C23C 16/402* (2013.01); *C23C 16/403* (2013.01); *C23C 16/404* (2013.01); *C23C 28/02* (2013.01); *C23C 28/021* (2013.01); *C23C 28/023* (2013.01); *C23C 28/321* (2013.01); *C23C 30/00* (2013.01); *C23C 30/005* (2013.01); *Y10T 428/1259* (2015.01); *Y10T 428/12583* (2015.01); *Y10T 428/12611* (2015.01); *Y10T 428/12618* (2015.01); *Y10T 428/12792* (2015.01); *Y10T 428/12799* (2015.01); *Y10T 428/12972* (2015.01); *Y10T 428/12979* (2015.01)

(58) Field of Classification Search
CPC ..... C23C 16/402; C23C 30/005; C23C 14/58; C23C 16/403; C23C 14/165; C23C 14/5846; C23C 14/5853; C23C 16/404; C23C 30/00; C23C 28/02; C23C 28/021; C23C 28/023; Y10T 428/1259; Y10T 428/12611; Y10T 428/12618; Y10T 428/12583; Y10T 428/12792; Y10T 428/12799; Y10T 428/12972; Y10T 428/12979; B32B 15/013; B32B 15/01; B32B 15/04; B32B 15/043; B32B 15/18
See application file for complete search history.

(56) References Cited

U.S. PATENT DOCUMENTS

| | | |
|---|---|---|
| 2004/0076868 A1 | 4/2004 | Mardilovich |
| 2004/0089967 A1 | 5/2004 | Chatard et al. |
| 2009/0232983 A1 | 9/2009 | Ammerlaan et al. |
| 2010/0151130 A1 | 6/2010 | Ammerlaan et al. |
| 2010/0285333 A1 | 11/2010 | Kwak et al. |
| 2015/0013409 A1 | 1/2015 | Monnoyer et al. |
| 2015/0218387 A1 | 8/2015 | Rupprecht et al. |

FOREIGN PATENT DOCUMENTS

| | | |
|---|---|---|
| JP | 8-3728 | 1/1996 |
| JP | 9-228030 | 9/1997 |
| JP | 9-241828 | 9/1997 |
| JP | 10-68063 | 3/1998 |
| JP | 10-219475 | 8/1998 |
| JP | 2008-523602 | 7/2008 |
| KR | 10-2007-0068215 | 6/2007 |
| KR | 10-0843839 | 7/2008 |

OTHER PUBLICATIONS

Chen, D., et al.; "Biocompatibility of Magnesium-Zinc Alloy in Biodegradable Orthopedic Implants"; International Journal of Molecular Medicine; No. 28, pp. 343-349; 2011.
English-Language European Search Report in corresponding Application No. PCT JR20102011540, dated Jul. 9, 2015.
English-language International Search Report from the Korean Patent Office for International Application No. PCT/KR2012/011540, dated Apr. 1, 2013.
First Office Action from the State Intellectual Property Office of the People's Republic of China in Chinese Patent Application No. 201280065252.1, dated Apr. 29, 2015.
Nishimura, K., et al.; "Highly Corrosion-Resistant Zn—Mg Alloy Galvanized Steel Sheet for Building Construction Materials"; Nippon Steel Technical Report; No. 81. pp. 85-88; 2000.
Notice of Office Action in counterpart Japanese Application No. 2014-550005, dated Jun. 30, 2015.
Prosek, T., et al.; "Corrosion Mechanism of Model Zinc-Magnesium Alloys in Atmospheric Conditions"; Corrosion Science; No. 50, pp. 2216-2231; 2008.
Schinkinger, B., et al.; "Chemical Structure and Morphology of Ultrathin Combustion CVD Layers on Zinc Coated Steel"; Applied Surface Science; No. 179, pp. 79-87; 2001.
Yao, C., et al.; "Effects of Mg on Microstructure and Corrosion Properties on Zn—Mg Alloy"; Journal of Alloys and Compounds; No. 602, pp. 101-107; 2014.
Notice of Office Action, issued by the Japanese Patent Office dated Oct. 4, 2016 in counterpart Japanese application No. 2015-214095.

* cited by examiner

[Figure 1]
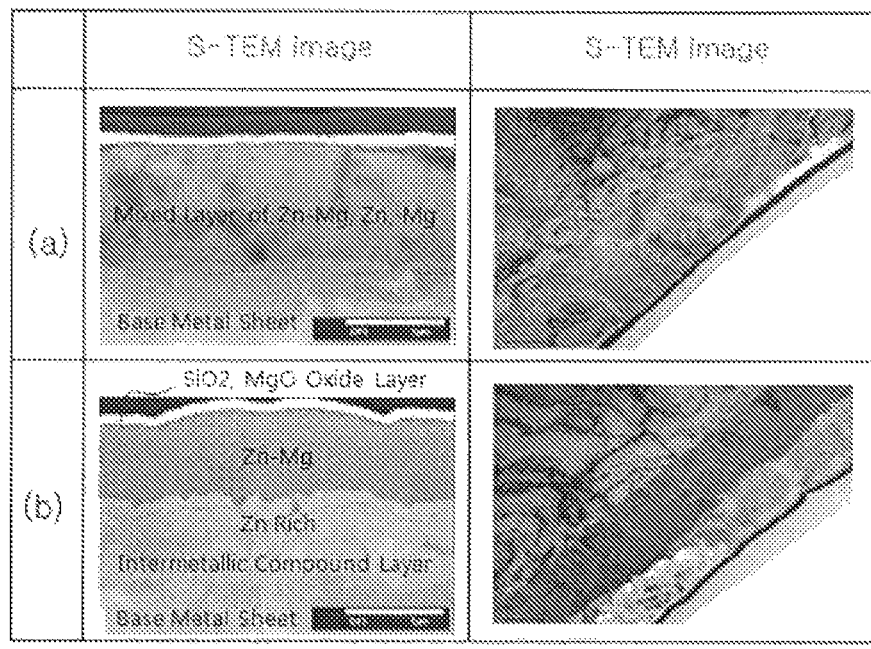
[Figure 2]
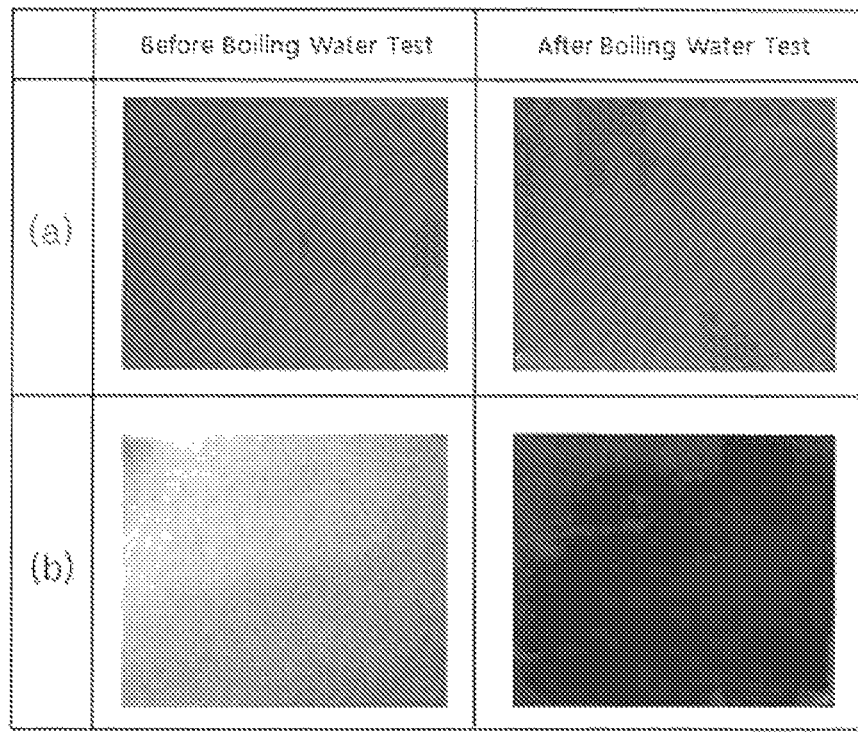

[Figure 3]
(a) 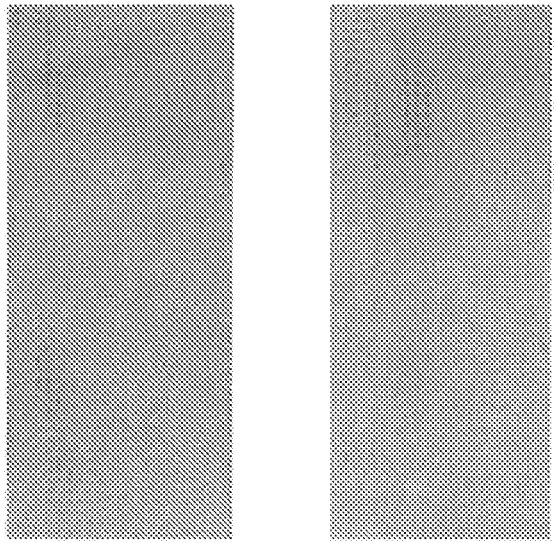
(b) 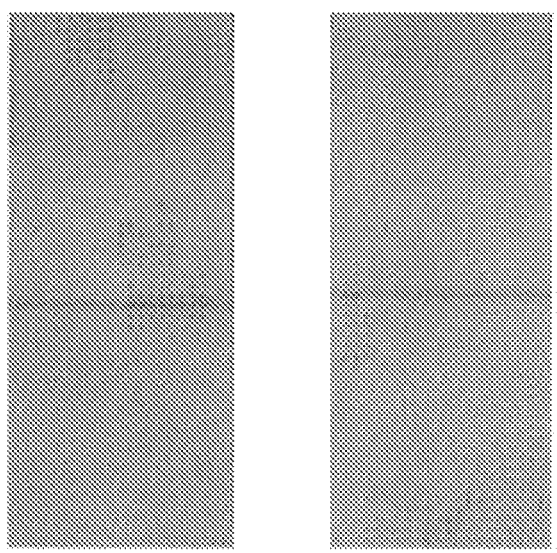

ZN—MG ALLOY-COATED STEEL SHEET WITH EXCELLENT BLACKENING RESISTANCE AND EXCELLENT ADHESION

This is a divisional application of U.S. patent application Ser. No. 14/368,724, filed Jun. 25, 2014 (now allowed), which is a national stage application under § 371 of International Patent Application No. PCT/KR2012/011540, filed Dec. 27, 2012, which claims priority to Korean Application No. 10-2011-0143891, filed Dec. 27, 2011. The disclosures of the above-referenced applications are expressly incorporated herein by reference to their entireties.

TECHNICAL FIELD

The present disclosure relates to a Zn—Mg alloy-coated steel sheet for use as a basic material in industrial applications such as in automobiles, home appliances, and constructions, and more particularly, to a Zn—Mg alloy-coated steel sheet having high blackening resistance and coating adhesion.

BACKGROUND ART

The surfaces of steel sheets may be galvanized by a method such as electrogalvanization and hot-dip galvanization so as to improve the corrosion resistance and durability of such steel sheets. As compared with non-coated steel sheets, galvanized steel sheets have high corrosion resistance owing to zinc functioning as a sacrificial anode and are thus widely used as materials for automobiles, home appliances, and constructions.

However, in such industrial fields, coated steel sheets being relatively lightweight and highly economical, in addition to having higher degrees of durability, are increasingly required.

Meanwhile, due to the limited amount of zinc deposits in the earth and concern about the depletion of zinc reserves, the trend of using zinc deposits as a weapon has increased. Moreover, existing electrogalvanizing processes and hot-dip galvanization processes consume a large amount of energy and emit pollutants, disadvantageous, in that regulations on pollutants are being strengthened worldwide.

Due to these reasons, Zn—Mg alloy-coated steel sheets formed by a vacuum deposition method have received attention. According to the vacuum deposition method, a coating process is performed in a vacuum to produce Zn—Mg alloy-coated steel sheets. Therefore, the emission of pollutants is very low, and production rates higher than those of existing plating processes may be obtained according to the development of techniques for evaporating coating materials. Moreover, since Zn—Mg alloy-coated steel sheets having high corrosion resistance and thin coating film thicknesses can be manufactured, Zn—Mg alloy-coated steel sheets have received attention as relatively economical future steel sheets.

Although Zn—Mg coatings have such merits in terms of manufacturing processes and product properties, Zn—Mg coatings are harder and more fragile than zinc coatings, and thus it is difficult to improve the adhesion of Zn—Mg coatings.

Furthermore, since magnesium (Mg) is very active, the surface of a product coated with Zn—Mg may react with moisture in humid environments, and thus the surface of the product may be blackened and worsened in quality.

Patent Document 1 discloses a technique for solving such a blackening problem. According to the technique disclosed in Patent Document 1, blackening of a Zn—Mg coated product is prevented by treating the Zn—Mg coated product with a 0.01% to 30% calcium phosphate solution so as to elute magnesium (Mg) and adjust the content of magnesium (Mg) in the surface of the Zn—Mg coated product to be 1 wt. % or less. However, according to the technique disclosed in Patent Document 1, magnesium (Mg) is not uniformly eluted. Thus, the surface of the Zn—Mg coated product may be stained or may be blackened due to the formation of calcium phosphate including magnesium (Mg) during a calcium phosphate solution treatment.

(Patent Document 1) Japanese Patent Application Laid-open Publication No. 1997-2418

DISCLOSURE

Technical Problem

Aspects of the present disclosure may include a Zn—Mg alloy-coated steel sheet having high blackening resistance and coating adhesion and a method for manufacturing the Zn—Mg alloy-coated steel sheet.

Technical Solution

According to an aspect of the present disclosure, a Zn—Mg alloy-coated steel sheet having high blackening resistance and coating adhesion may include: a base steel sheet; a Zn—Fe intermetallic compound layer formed on the base steel sheet; a first Zn—Mg coating layer formed on the Zn—Fe intermetallic compound layer and including a Zn—Mg intermetallic compound in which zinc (Zn) is included in an amount of 95 wt % or greater; a second Zn—Mg coating layer formed on the first Zn—Mg coating layer and including a Zn—Mg intermetallic compound in which zinc (Zn) is included in an amount of 80 wt % to 95 wt %; and an oxide film formed on the second Zn—Mg coating layer and including a metal oxide.

According to another aspect of the present disclosure, a method for manufacturing a Zn—Mg alloy-coated steel sheet having high blackening resistance and coating adhesion may include: forming a Zn—Mg coating layer on a base steel sheet; and performing a combustion chemical vapor deposition (CCVD) process to form an oxide film.

Advantageous Effects

According to the present disclosure, an oxide film is formed on a Zn—Mg alloy-coated steel sheet by a combustion chemical vapor deposition (CCVD) process to improve coating adhesion and resistance to blackening caused by moisture, which are demerits of existing steel sheets. Therefore, the Zn—Mg alloy-coated steel sheet of the present disclosure may be provided as an inexpensive basic industrial material in industrial applications such as automobiles, home appliances, and constructions. In addition, the Zn—Mg alloy-coated steel sheet may be commercialized as a steel sheet having high durability and high-quality surfaces and may have a large market share.

DESCRIPTION OF DRAWINGS

FIG. 1 illustrates S-TEM and TEM images (a) of sections of a conventional sample and S-TEM and TEM images (b) of sections of an inventive sample.

FIG. 2 illustrates images (a) of the inventive sample and images (b) of the conventional sample taken before and after a boiling water test.

FIG. 3 illustrates results (a) of a coating adhesion test (tape test) performed on the inventive sample and results (b) of a coating adhesion test (tape test) performed on the conventional sample.

BEST MODE

A combustion chemical vapor deposition (CCVD) method used in embodiments of the present disclosure is different from a conventional physical vapor deposition (PVD) method or a conventional chemical vapor deposition (CVD) method, in that a hydrocarbon (e.g., propane) used as a fuel is mixed with air in which a precursor (e.g., HMDSO (raw-material gas molecules)) is saturated, and heat generated by combusting the mixture (gas mixture) at atmospheric pressure is used as an energy source for the precursor to undergo evaporation, decomposition, and a chemical reaction, so as to form a coating layer on a surface.

In the embodiments of the present disclosure, organic silane is used as a precursor in a CCVD process so as to form a metal oxide (such as a silicon oxide) having cross-linked bonds by coupling with oxygen from air on a metal surface as a deposition coating layer.

Hereinafter, the embodiments of the present disclosure will be described in detail.

The inventors found that coating layers of Zn—Mg alloy-coated steel sheets formed by a PVC method have unevenly distributed Zn—Mg, Zn, and Mg crystal regions and are easily separated due to fine natural oxide layers formed between the coating layers and the Zn—Mg alloy-coated steel sheets. In addition, the inventors found that Zn—Mg alloy-coated steel sheets formed by a PVC method are blackened as hydrates are formed thereon due to a reaction with moisture.

Thus, the inventors have exposed a Zn—Mg alloy-coated steel sheet to high-temperature flame by using a CCVD method. In this case, a coating layer of the Zn—Mg alloy-coated steel sheet was made uniform, and the adhesion of the coating layer was increased. In addition, blackening of the coating layer was prevented by an oxide film. Based on this knowledge, the inventors invented the Zn—Mg alloy-coated steel sheet of the present disclosure.

In the CCVD method, a gaseous mixture of a hydrocarbon (propane) and air in which raw-material gas molecules (precursor) are saturated is combusted at atmospheric pressure, and heat generated by the combustion is used as an energy source so as to form an oxide film having a cross-linked structure by evaporating, decomposing, and oxidizing the raw-material gas molecules.

First, a Zn—Mg alloy-coated steel sheet will be described in detail according to an embodiment of the present disclosure.

The Zn—Mg alloy-coated steel sheet of the embodiment includes:
a base steel sheet;
a ZN—Fe intermetallic compound layer formed on the base steel sheet;
a first Zn—Mg coating layer formed on the Zn—Fe intermetallic compound layer and including a Zn—Mg intermetallic compound in which zinc (Zn) is included in an amount of 95 wt % or greater;
a second Zn—Mg coating layer formed on the first Zn—Mg coating layer and including a Zn—Mg intermetallic compound in which zinc (Zn) is included in an amount of 80 wt % to 95 wt %; and
an oxide film formed on the second Zn—Mg coating layer and including an metal oxide.

The kind of the base steel sheet is not limited. That is, any kinds of steel sheets such as a hot-rolled steel sheet and a cold-rolled steel sheet and any kinds of metal sheets may be applied to the present embodiment.

The Zn—Fe intermetallic compound layer is formed on the base steel sheet. In a CCVD process (described later), a fine oxide film existing between the base steel sheet and a Zn—Mg coating layer may be diffused into the Zn—Mg coating layer, and thus a Zn—Fe intermetallic compound layer may be formed. The Zn—Fe intermetallic compound layer improves the adhesion between the base steel sheet and the Zn—Mg coating layer.

The first Zn—Mg coating layer is formed on the Zn—Fe intermetallic compound layer and includes a Zn—Mg intermetallic compound in which zinc (Zn) is included in an amount of 95 wt % or greater. The first Zn—Mg coating layer is a soft Zn-rich region. Therefore, the first Zn—Mg coating layer has high adhesion.

If the content of zinc (Zn) in the first Zn—Mg coating layer is less than 95 wt %, the first. Zn—Mg coating layer may become fragile due to the influence of a Zn—Mg alloy, and thus the adhesion of the first Zn—Mg coating layer may not be high. Therefore, a higher content of zinc (Zn) may be favored. However, to form a Zn—Mg intermetallic compound, it may be preferable that the content of zinc (Zn) be less than 100 wt %.

The second Zn—Mg coating layer is formed on the first Zn—Mg coating layer and includes a Zn—Mg intermetallic compound in which zinc (Zn) is included in an amount of 80 wt % to 95 wt %. The second Zn—Mg coating layer has a high resistance to corrosion as compared with a general zinc coating layer because of Zn—Mg alloy characteristics.

It may be preferable that the Zn—Mg intermetallic compound have a zinc content of 80 wt % to 95 wt %. If the content of zinc is less than 80 wt %, the corrosion resistance of the second Zn—Mg coating layer is decreased due to the influence of a Zn—Mg alloy coating layer having a different crystal shape.

The oxide film is formed on the second Zn—Mg coating layer. The oxide film includes a metal oxide. The oxide film blocks the permeation of moisture and thus prevents blackening.

The oxide film includes a metal oxide (e.g., a silicon oxide ($SiO_2$)) formed by a CCVD process. In addition, during the CCVD process, magnesium oxide (MgO) is formed by oxygen of high-temperature air as a natural oxide film and coexists with the oxide film.

It may be preferable that the oxide film have a thickness of 10 nm to 40 nm. If the thickness of the oxide film is less than 10 nm, the permeation of moisture may not be sufficiently prevented, and thus sufficient blackening resistance may not be obtained. On the other hand, if the thickness of the oxide film is greater than 40 nm, oxide particles (that is, $SiO_2$ particles of the oxide film) may be coarsened, and thus the oxide film may not function as a barrier film.

Hereinafter, a method of manufacturing a Zn—Mg alloy-coated steel sheet will be described in detail according to an embodiment of the present disclosure.

First, a Zn—Mg coating layer is formed on a base steel sheet. At this time, the Zn—Mg coating layer is not the first and second Zn—Mg coating layers described in the previous embodiment. That is, the Zn—Mg coating layer is not a final Zn—Mg coating layer. The Zn—Mg coating layer will be modified by a later CCVD process.

The Zn—Mg coating layer may be formed by a PVD method. For example, the Zn—Mg coating layer may be formed by a conventional PVD method known in the related art.

For example, in a thermal-PVD or sputtering method, a large amount of Zn—Mg or a raw coating material including Zn and Mg is evaporated in a vacuum by using thermal energy or ion collision energy, and the evaporated Zn—Mg or raw coating material is directed to the surface of a steel sheet or metal sheet continuously fed into the vacuum by a roll-to-roll method, so as to form a Zn—Mg alloy coating layer on the steel sheet or metal sheet. The thermal-PVD or sputtering method may be used to form the Zn—Mg coating layer of the embodiment of the present disclosure. Particularly, in an electro magnetic PVD (EML-PVD) method, a kind of thermal-PVD method using electromagnetic induction, a Zn—Mg alloy coating material is levitated and heated in a vacuum by electromagnetic induction so as to rapidly generate a large amount of vapor and form a coating layer using the vapor. The EML-PVD method is widely used for producing Zn—Mg coated products owing to a high production rate and economic benefits.

A CCVD process is performed on the base steel sheet on which the Zn—Mg coating layer is formed, so as to form an oxide film thereon. In detail, through the CCVD process, such layers (films) as described in the previous embodiment are formed on the base steel sheet. That is, a Zn—Fe intermetallic compound layer is formed on the base steel sheet; a first Zn—Mg coating layer including a Zn—Mg intermetallic compound in which zinc (Zn) is contained in an amount of 95 wt % or greater is formed on the Zn—Fe intermetallic compound layer; a second Zn—Mg coating layer including a Zn—Mg intermetallic compound in which zinc (Zn) is included in an amount of 80 wt % to 95 wt % is formed on the first Zn—Mg coatine layer; and an oxide film including an metal oxide is formed on the second Zn—Mg coating layer. In this way, a Zn—Mg alloy-coated steel sheet is manufactured according to the manufacturing method of the embodiment of the present disclosure.

In the CCVD process, the base steel sheet may be spaced apart from a burner of a CCVD apparatus by a distance of 10 mm or less. Furthermore, in the CCVD process, if air and precursor vapor are supplied according to the following ratio, a metal oxide deposition film having optimized characteristics may be formed.

Precursor flow rate:air flow rate 0.8:210 to 2.1:210 (L/min)

If the ratio of the flow rates is less than 0.8:210 (L/min), since the number of film-forming particles is small relative to the amount of air, an excessively thin or fine film not functioning as a barrier may be formed. On the other hand, if the ratio of the flow rates is greater than 2.1:210 (L/min), since precursor particles clump together (coarse particles), a film (coating) may not be densely formed and thus may not function as a barrier.

In the CCVD process, it may be preferable that the base steel sheet be maintained within a temperature range of 330° C. to 450° C. If the base steel sheet is maintained at a temperature lower than 330° C., a coating layer may not have sufficient energy necessary for diffusion of atoms, and thus the coating layer may not become homogeneous during the CCVD process. On the other hand, if the base steel sheet is maintained at a temperature higher than 450° C., a Zn—Fe alloying reaction may intensively occur between the base steel sheet and the first Zn—Mg coating layer having a high density of zinc (Zn), and thus a Zn—Fe alloy layer may be excessively formed to adversely affect coating adhesion.

MODE FOR INVENTION

Hereinafter, an example of the present disclosure will be described in detail. The following example is for illustrative purposes and is not intended to limit the scope of the present disclosure.

Example

The following experiment was conducted to evaluate the blackening resistance and coating adhesion of steel sheets according to the thicknesses of oxide films and the heating temperature of the steel sheets.

General cold-rolled steel sheets (continuous strip coils) were prepared. Then, an EML-PVD process, a kind of thermal-PVD process using electromagnetic induction, was performed on the cold rolled steel sheets. Specifically, in the EML-PVD process, a Zn—Mg alloy coating material was levitated and heated in a vacuum by electromagnetic induction so as to rapidly generate a large amount of vapor, and the vapor was directed to surfaces of the cold-rolled steel sheets continuously fed into the vacuum by a roll-to-roll method, so as to form Zn—Mg coating layers on the cold-rolled steel sheets.

Thereafter, the steel sheets on which the Zn—Mg coating layers were formed were subjected to a CCVD process so as to form silicon oxide films on the steel sheets by using organic silane. In this way, Zn—Mg alloy-coated steel sheets on which oxide films were formed were manufactured. In the CCVD process, the oxide films were formed on the steel sheets to different thicknesses (processing cycles) at different temperatures as shown in Table 1.

Referring to Table 1, Comparative Samples (steel sheets) to 7 to 10 were tested while varying temperatures thereof without forming oxide films thereon so as to evaluate the coating adhesion of the Comparative Samples 7 to 10 according to the temperatures of the Comparative Samples 7 to 10 in the CCVD process.

The blackening resistance and coating adhesion of each of the Zn—Mg alloy-coated steel sheets were tested as shown in Table 1, The coating adhesion of each of the Zn—Mg alloy-coated steel sheets was evaluated by attaching tape to the steel sheet (sample), bending the steel sheet, separating the tape, and observing the tape to determine whether the coating adhesion was good or bad according to the separation of the coating layer from the steel sheet. The blackening resistance of each of the Zn—Mg alloy-coated steel sheets was evaluated by immersing the steel sheet in boiling water and observing the color of the steel sheet to determine whether blackening resistance was good or bad according to the change of the color of the steel sheet.

TABLE 1

| No. | Thickness of oxide film (CCVD process cycles) | Sample Te. (° C.) | Blackening resistance | Coating adhesion |
| --- | --- | --- | --- | --- |
| Conventional Sample | Not processed | — | X | X |
| Inventive Sample | 22 nm (50 cycles) | 330 | ○ | ○ |
| Comparative | 5 nm | 45 | X | X |

TABLE 1-continued

| No. | Thickness of oxide film (CCVD process cycles) | Sample Te. (° C.) | Blackening resistance | Coating adhesion |
|---|---|---|---|---|
| Sample 1 | (3 cycles) | | | |
| Comparative Sample 2 | 11 nm (6 cycles) | 80 | ○ | X |
| Comparative Sample 3 | 22 nm (12 cycles) | 110 | ○ | X |
| Comparative Sample 4 | 32 nm (18 cycles) | 120 | ○ | X |
| Comparative Sample 5 | 40 nm (30 cycles) | 180 | ○ | X |
| Comparative Sample 6 | 48 nm (50 cycles) | 330 | — | ○ |
| Comparative Sample 7 | — (30 cycles) | 180 | X | X |
| Comparative Sample 8 | — (50 cycles) | 330 | X | ○ |
| Comparative Sample 9 | — (75 cycles) | 425 | X | ○ |
| Comparative Sample 10 | — (100 cycles) | 480 | X | X |

An inventive sample satisfying conditions of the embodiments of the present disclosure has high blackening resistance and coating adhesion. FIG. 1 illustrates a structure (a) of a conventional sample and a structure (b) of the inventive sample. Referring to FIG. 1, in the conventional sample, a Zn—Mg alloy coating layer is formed on a base steel sheet as a mixed layer. However, in the inventive sample, an intermetallic compound layer, a Zn-rich layer, a Zn—Mg alloy layer, and an outermost oxide film are formed on a base steel sheet. Therefore, the inventive sample formed according to the embodiments of the present disclosure has high blacking resistance and coating adhesion.

Comparative Samples 1 and 6 not satisfying the oxide film thickness condition of the embodiments of the present disclosure have poor blackening resistance. Comparative Samples 2 to 5 satisfying the oxide film thickness condition of the embodiments of the present disclosure but not satisfying the temperature condition, of the embodiments of the present disclosure have good blackening resistance but poor coating adhesion.

Comparative Samples 8 and 9, satisfying the temperature conditions of the embodiments of the present disclosure, have good coating adhesion. However, since oxide films are not formed on Comparative Samples 8 and 9, Comparative Samples 8 and 9 have poor blackening resistance. Comparative Samples 7 and 10, not satisfying the temperature condition of the embodiments of the present disclosure, have poor coating adhesion.

FIG. 2 illustrates images (a) of the inventive sample and images (b) of the conventional sample taken before and after a boiling water test. Referring to FIG. 2, the color of the inventive sample is not changed. That is, the inventive sample has high blackening resistance. However, the conventional sample is entirely blackened.

FIG. 3 illustrates results (a) of a tape test performed on the inventive sample and results (b) of a tape test performed on the conventional sample. Referring to FIG. 3, the inventive sample has higher coating adhesion than the conventional sample.

The invention claimed is:

1. A Zn—Mg alloy-coated steel sheet having improved blackening resistance and coating adhesion, the Zn—Mg alloy-coated steel sheet comprising:
   a base steel sheet;
   a Zn—Fe intermetallic compound layer formed on the base steel sheet;
   a first Zn—Mg coating layer formed on the Zn—Fe intermetallic compound layer and comprising a Zn—Mg intermetallic compound in which zinc (Zn) is included in an amount of 95 wt % or greater and less than 100 wt %;
   a second Zn—Mg coating layer formed on the first Zn—Mg coating layer and comprising a Zn—Mg intermetallic compound in which zinc (Zn) is included in an amount of 80 wt % to 95 wt %; and
   an oxide film formed on the second Zn—Mg coating layer, the oxide film being formed of $SiO_2$ film and having a thickness between 11 nm to 40 nm.

2. The Zn—Mg alloy-coated steel sheet of claim 1, wherein the $SiO_2$ oxide film is formed by a combustion chemical vapor deposition (CCVD) process.

3. The Zn—Mg alloy-coated steel sheet of claim 2, wherein in the CCVD process, an organic silane is used as a precursor.

4. The Zn—Mg alloy-coated steel sheet of claim 2, wherein in the CCVD process, the base steel sheet is maintained within a temperature range of 330° C. to 450° C.

5. The Zn—Mg alloy-coated steel sheet of claim 1, wherein the first Zn—Mg coating layer and the second Zn—Mg coating layer are formed using physical vapor deposition (PVD).

* * * * *